(12) United States Patent
Chiang

(10) Patent No.: US 7,838,312 B2
(45) Date of Patent: Nov. 23, 2010

(54) LIGHT-EMITTING DIODE LIGHT BAR AND METHOD FOR MANUFACTURING THE SAME

(75) Inventor: Chin-Chih Chiang, Chung Ho (TW)

(73) Assignee: Jess-Link Products Co., Ltd., Taipei (TW)

( * ) Notice: Subject to any disclaimer, the term of this patent is extended or adjusted under 35 U.S.C. 154(b) by 0 days.

(21) Appl. No.: 12/431,123

(22) Filed: Apr. 28, 2009

(65) Prior Publication Data

US 2010/0163917 A1   Jul. 1, 2010

(30) Foreign Application Priority Data

Dec. 31, 2008   (TW) ............... 97151548 A

(51) Int. Cl.
*H01L 21/00* (2006.01)
(52) U.S. Cl. .................. 438/26; 438/27; 362/249.01
(58) Field of Classification Search ............. 438/26–27; 362/249.01
See application file for complete search history.

(56) References Cited

U.S. PATENT DOCUMENTS

| | | | | |
|---|---|---|---|---|
| 4,514,791 A * | 4/1985 | Tokieda | ................. | 362/249.01 |
| 4,823,106 A * | 4/1989 | Lovell | ........................ | 338/212 |
| 5,550,408 A * | 8/1996 | Kunitomo et al. | ........... | 257/737 |
| 6,880,955 B2 * | 4/2005 | Lin | ............................. | 362/237 |
| 7,173,289 B1 * | 2/2007 | Wu et al. | ...................... | 257/98 |
| 7,301,174 B1 * | 11/2007 | Popovich | ..................... | 257/88 |
| 7,303,315 B2 * | 12/2007 | Ouderkirk et al. | ........... | 362/294 |
| 7,422,345 B2 * | 9/2008 | Lin | ........................ | 362/249.01 |
| 7,478,925 B2 * | 1/2009 | Hiyama et al. | .......... | 362/249.02 |
| 7,507,012 B2 * | 3/2009 | Aylward et al. | ............. | 362/625 |
| 7,556,405 B2 * | 7/2009 | Kingsford et al. | ........... | 362/294 |
| 2002/0149933 A1 * | 10/2002 | Archer et al. | ............... | 362/234 |
| 2006/0279679 A1 * | 12/2006 | Fujisawa et al. | ............. | 349/116 |
| 2007/0223226 A1 * | 9/2007 | Park | ........................... | 362/267 |
| 2007/0272933 A1 * | 11/2007 | Kim et al. | ...................... | 257/94 |
| 2009/0020770 A1 * | 1/2009 | Wang et al. | .................... | 257/91 |
| 2009/0065789 A1 * | 3/2009 | Wang et al. | .................... | 257/88 |
| 2009/0146156 A1 * | 6/2009 | Wang et al. | .................... | 257/88 |
| 2009/0152570 A1 * | 6/2009 | Wang et al. | .................... | 257/88 |
| 2009/0224266 A1 * | 9/2009 | Wang et al. | .................... | 257/88 |
| 2009/0224653 A1 * | 9/2009 | Wang et al. | .................. | 313/502 |
| 2010/0099207 A1 * | 4/2010 | Wang et al. | ................... | 438/27 |
| 2010/0163916 A1 * | 7/2010 | Chiang | ........................ | 257/99 |
| 2010/0163917 A1 * | 7/2010 | Chiang | ........................ | 257/99 |
| 2010/0171132 A1 * | 7/2010 | Ahn et al. | ...................... | 257/94 |

FOREIGN PATENT DOCUMENTS

TW            558622         10/2003

* cited by examiner

*Primary Examiner*—Laura M Menz
(74) *Attorney, Agent, or Firm*—Chun-Ming Shih; HDLS IPR Services

(57) ABSTRACT

In a light-emitting diode light bar of a light-emitting device, a first lead and a second lead are juxtaposed with a distance. A light-emitting diode crystal has a first electrode and a second electrode. Then, the first electrode is electrically fixed to the first lead. The second electrode is electrically connected to the second lead via a metallic lead. A light-transmitting body is used to package the light-emitting diode crystal and the metallic lead. Finally, via a hot pressing process, an insulating layer covers the first lead and the second lead. In this way, a light-emitting diode light bar is formed.

7 Claims, 5 Drawing Sheets

LIGHT-EMITTING DIODE LIGHT BAR AND METHOD FOR MANUFACTURING THE SAME

BACKGROUND OF THE INVENTION

1. Field of the Invention

The present invention relates to a light-emitting device, and in particular to a light-emitting diode light bar.

2. Description of Prior Art

Since Light Emitting Diode (LED) has many advantages such as low electricity consumption, long lifetime, small volume, quick response or the like, it is used in various light-emitting devices to replace the traditional bulbs. For example, the LED can be used in decorative light bars.

With regard to the patent documents in which a LED is used as a light-emitting element, Taiwan Patent Publication No. 558622 discloses an adhesive light bar and a method for manufacturing the same. According to the disclosure of this patent document, a lower adhesive layer and an upper adhesive layer are used to bind a conductive unit there between. Then, a connecting process is performed, whereby a connecting lead is electrically connected to a light source unit and the conductive unit. Finally, a packaging process is performed, whereby the light source unit and the connecting lead can be covered to form a light bar.

However, in the above-mentioned patent document, the conductive unit is bound between the upper and lower adhesive layers. When the light bar is bent substantially, the upper and lower adhesive layers may be detached from each other due to the bending deformation. At this time, the conductive unit bound between these adhesive layers may be loosened and moved, which further results in the breakage of tiny connecting leads. As a result, the light source unit is damaged and the aesthetic feeling of the light bar is upset when emitting light is deteriorated.

Therefore, in order to overcome the above problems, the present Inventor proposes a reasonable and novel structure based on his delicate researches and expert experiments.

SUMMARY OF THE INVENTION

The present invention is to provide a light-emitting diode light bar that can withstand a large bending deformation.

The present invention is to provide a light-emitting diode light bar having a first lead and a second lead that are juxtaposed with a distance. Further, a light-emitting diode crystal having a first electrode and a second electrode is provided. The first electrode is electrically fixed to the first lead. The second electrode is electrically connected to the second lead via a metallic lead. A light-transmitting body is used to package the light-emitting diode crystal and the metallic lead. Finally, an insulating layer covers the first lead and the second lead via a hot pressing process. In this way, a light-emitting diode light bar can be formed.

In comparison with prior art, the present invention has advantageous features as follows. Since the insulating layer is formed by means of a hot pressing process so as to cover the first lead and the second lead, the insulating layer can still cover the first lead and the second lead firmly without any displacement even the light-emitting diode light bar is subjected to a large binding deformation. Thus, the breakage of the metallic lead connecting the light-emitting diode crystal and the second lead caused by the displacement of the insulating layer as well as the damage of the light-emitting diode crystal can be prevented. In this way, the aesthetic feeling of the light bar when emitting light can be maintained, so that the practicability of the present invention can be increased.

DETAILED DESCRIPTION OF THE INVENTION

The characteristics and technical contents of the present invention will be explained with reference to the accompanying drawings. However, the drawings are illustrative only but not used to limit the present invention.

Figure 1:
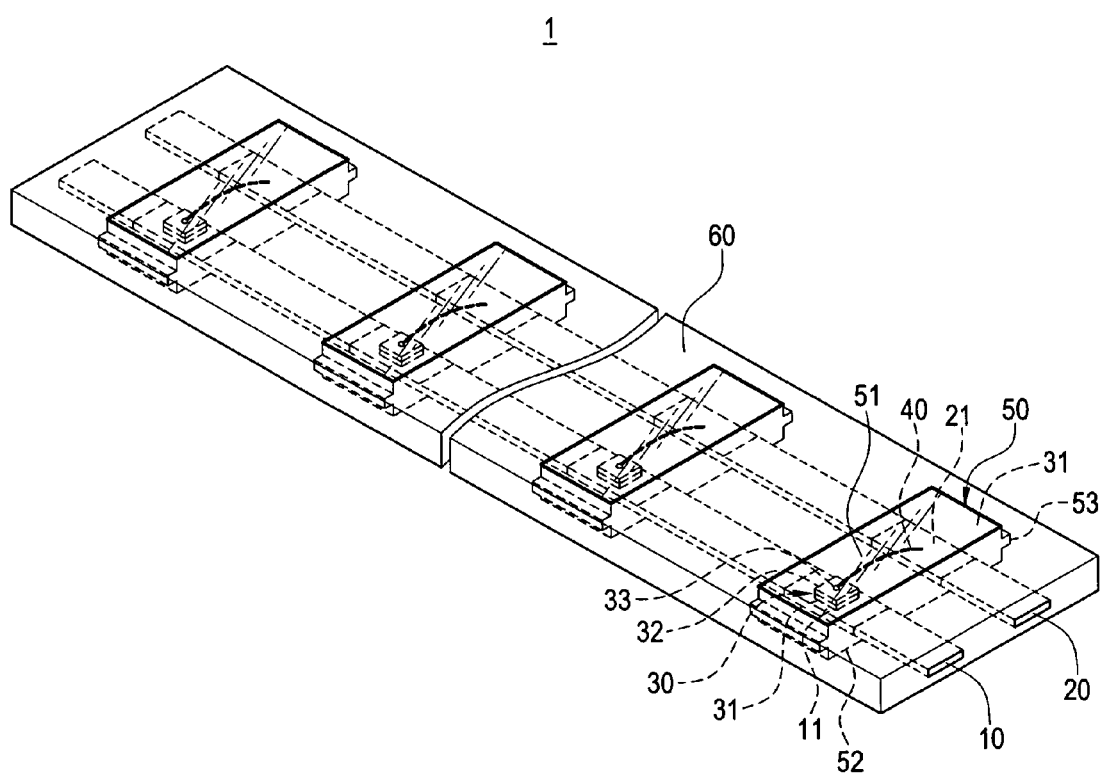
FIG. 1 is a perspective view showing the external appearance of the present invention.

Please refer to FIG. 1, which is a perspective view showing the external appearance of the light-emitting diode light bar of the present invention. The present invention provides a light-emitting diode light bar 1, which includes a first lead 10 and a second lead 20. The second lead 20 is separated from the first lead 10 by a distance.

A light-emitting diode crystal 30 is disposed on the first lead 10. The light-emitting diode crystal 30 has a first electrode 31 and a second electrode 32. The first electrode 31 is electrically fixed to the first lead 10. The second electrode 32 and the second lead 20 are connected to each other via a metallic lead 40. The metallic lead 40 can be a golden wire or other alternative metallic wires for wiring. In the present embodiment, the second electrode 32 is provided with a metallic pad 33. The metallic lead 40 is electrically connected to the metallic pad 33 and the second lead 20.

After completing the electrical connection of the light-emitting diode crystal 30, a light-transmitting body 50 is used to seal the outside of the light-emitting diode crystal 30 and the metallic lead 40. The light-transmitting body 50 is made of transparent epoxy resin or other rubber. One side of the light-transmitting body 50 for packaging the light-emitting diode crystal 30 is referred to as an illustrated surface 51, while the other side is referred to as a back-lighted surface 52. The first lead 10 and the second lead 20 on both sides of the light-transmitting body 50 are formed with a lead-exposing region 100 respectively.

Finally, an insulating layer 60 covers the outer surface of the lead-exposing region 100. The insulating layer 60 is formed by means of a hot pressing process, and is made of plastic materials. The insulating layer 60 further covers the illuminated surface 51 or the back-lighted surface 52 of the light-transmitting body 50. Also, the insulating layer 60 covers the light-transmitting body 50 completely.

Figure 2:
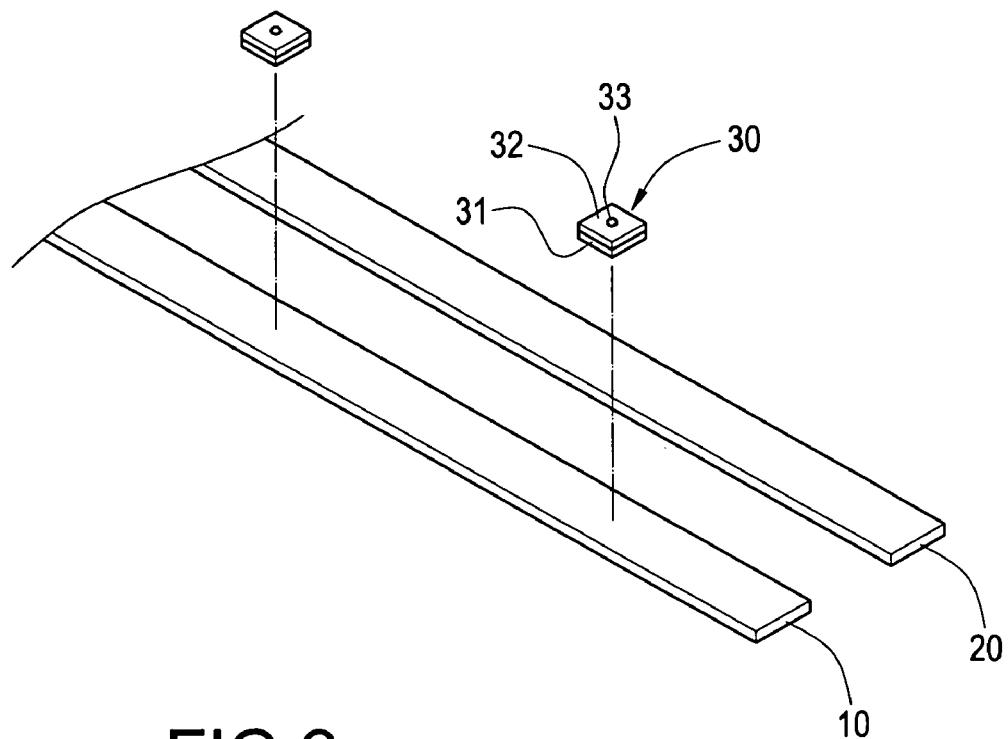
FIG. 2 is a schematic view showing the first lead, the second lead and the light-emitting diode crystal of the present invention.
Figure 7:
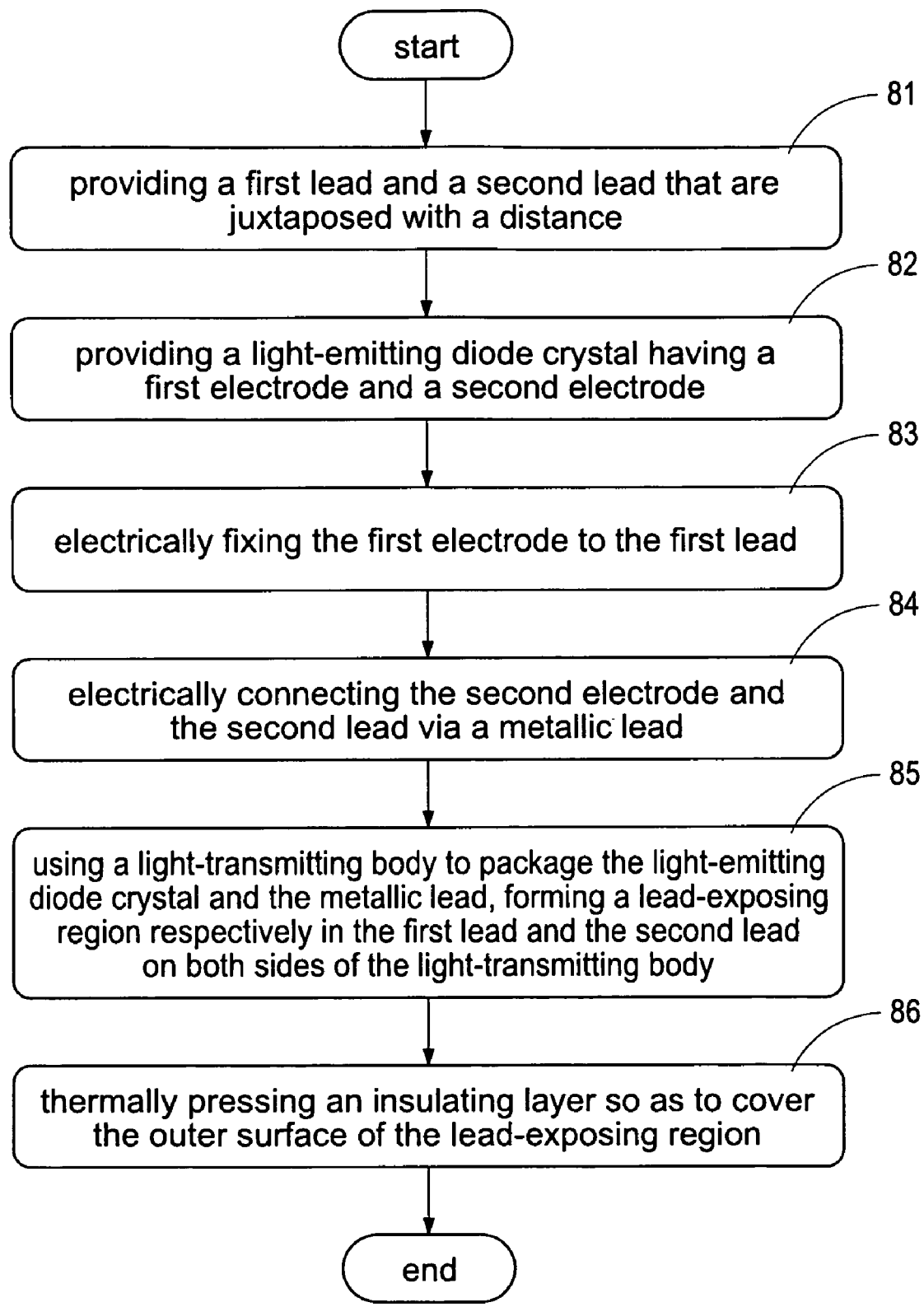
FIG. 7 is a flow chart showing the steps of the method for manufacturing the present invention.

Please refer to FIGS. 2 to 5, which show the manufacturing of the light-emitting diode light bar of the present invention. Please also refer to FIG. 7, which is a flow chart showing the steps of the method for manufacturing the light-emitting diode light bar of the present invention. First, as shown in FIG. 2, a first lead 10 and a second lead 20 that are juxtaposed with a distance are provided (step 81). Further, a light-emitting diode crystal 30 is provided (step 82). The light-emitting diode crystal 30 has a first electrode 31 and a second electrode 32. The second electrode 32 is provided with a metallic pad 33.

Figure 3:
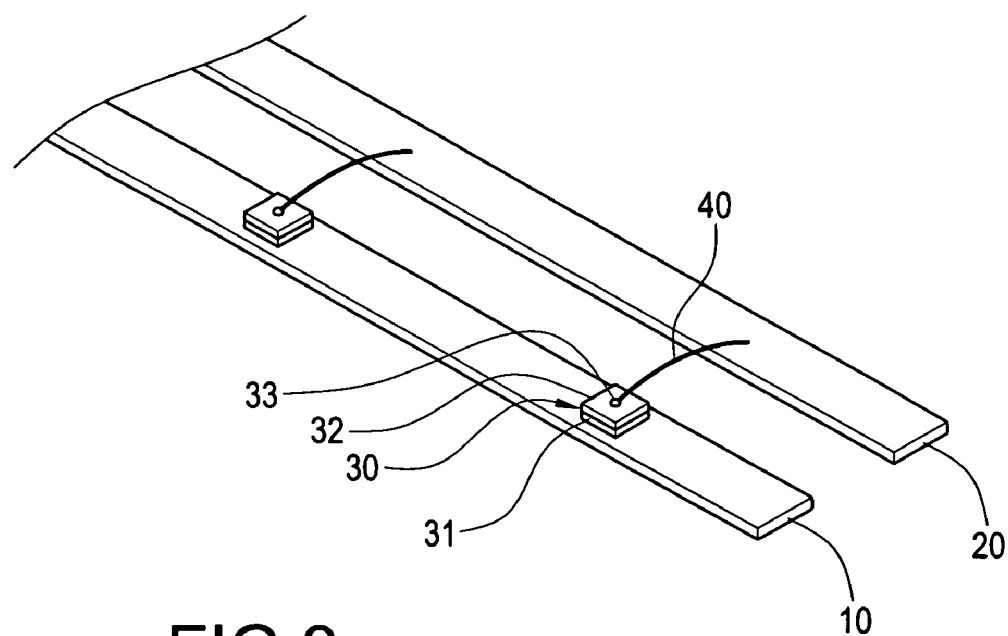
FIG. 3 is a schematic view showing the light-emitting diode crystal being electrically connected to the first lead and the second lead in accordance with the present invention.

Then, as shown in FIG. 3, the first electrode 31 of the light-emitting diode crystal 30 is electrically connected to the first lead 10 (step 83). The second electrode 32 of the light-emitting diode crystal 30 is electrically connected to the second lead 20 via a metallic lead 40 (step 84). In the present embodiment, the metallic lead 40 is electrically connected from the metallic pad 33 of the light-emitting diode crystal 30 to the second lead 20.

Figure 4:
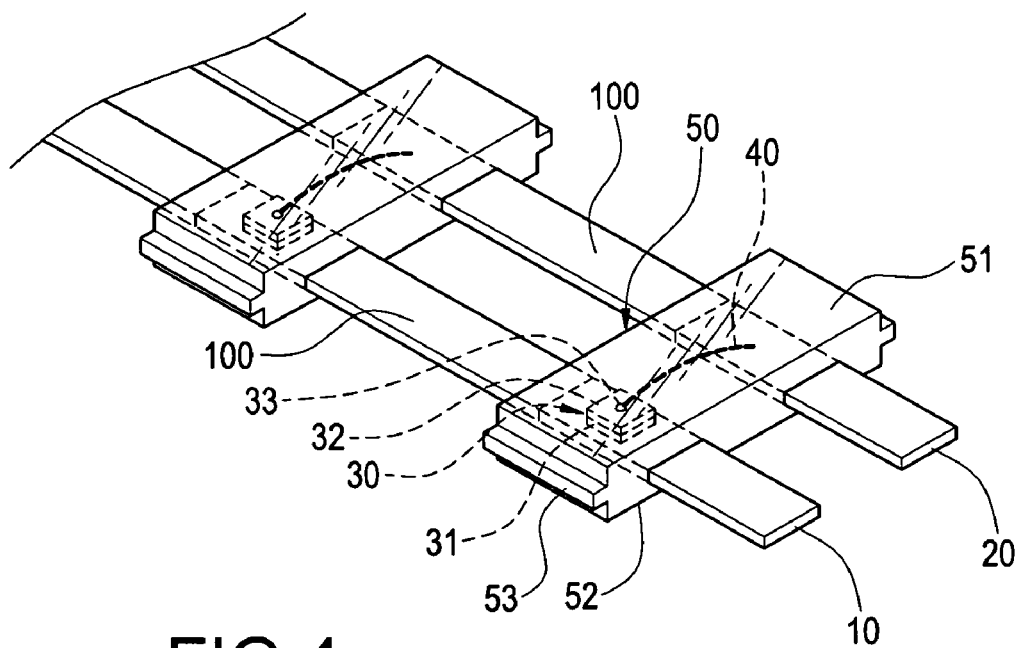
FIG. 4 is a schematic view showing the light-transmitting body of the present invention for sealing the light-emitting diode crystal.

Please refer to FIG. 4. A light-transmitting body 50 is used to package the light-emitting diode crystal 30 and the metallic lead 40 (step 85). The first lead 10 and the second lead 20 on both sides of the light-transmitting body 50 are formed with a lead-exposing region 100 respectively. One side of the light-transmitting body 50 for packaging the light-emitting diode crystal 30 is referred to as an illuminated surface 51, while the other side is referred to as a back-lighted surface 52.

Figure 5:
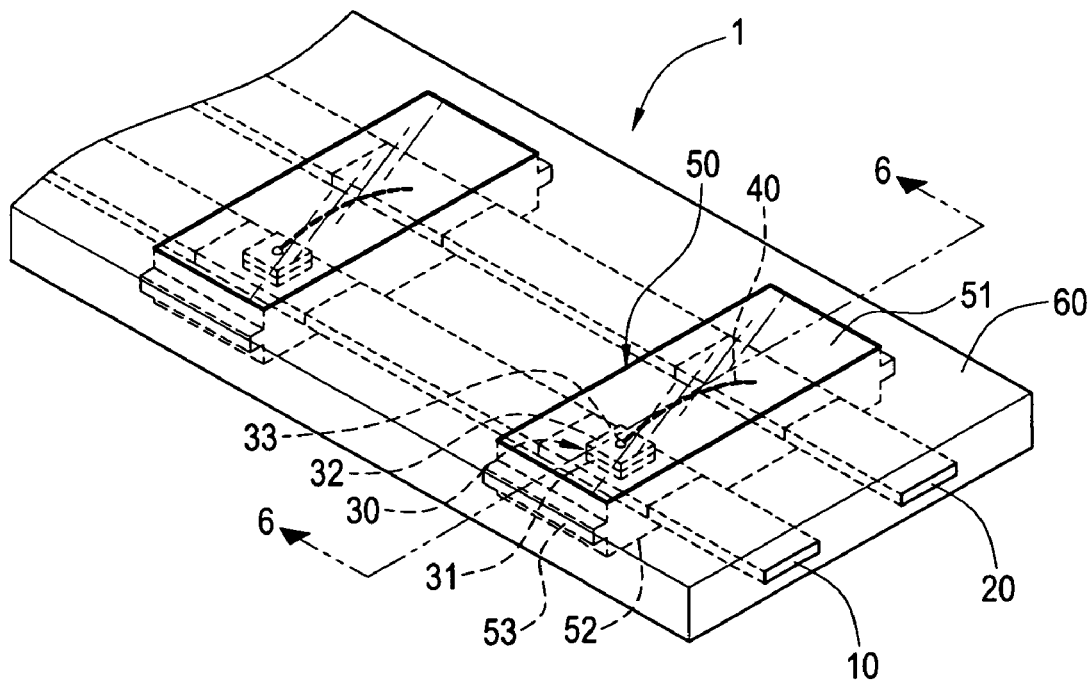
FIG. 5 is a schematic view showing the insulating layer being thermally pressed on the first lead and the second lead in accordance with the present invention.
Figure 6A:
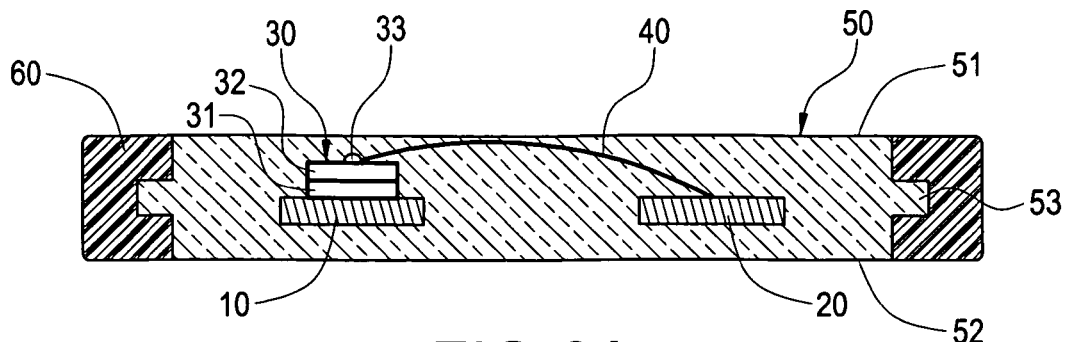
FIG. 6A is a cross-sectional view taken along the line 6-6 in FIG. 5.
Figure 6B:
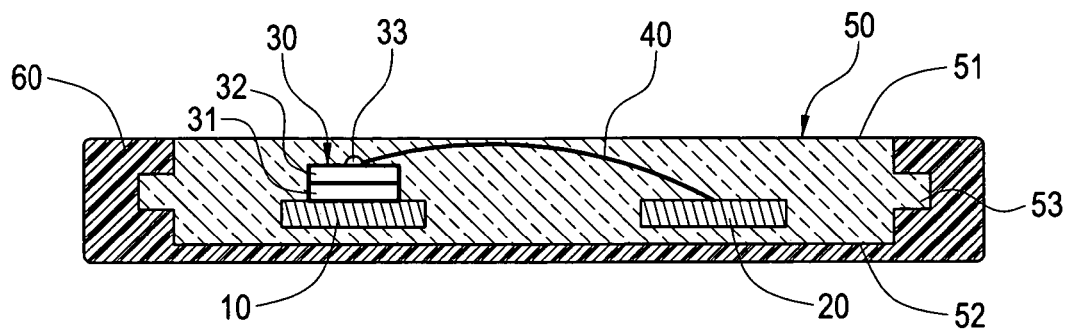
FIG. 6B is a cross-sectional view showing a back-lighted surface of the insulating layer covering the light-transmitting body.
Figure 6C:
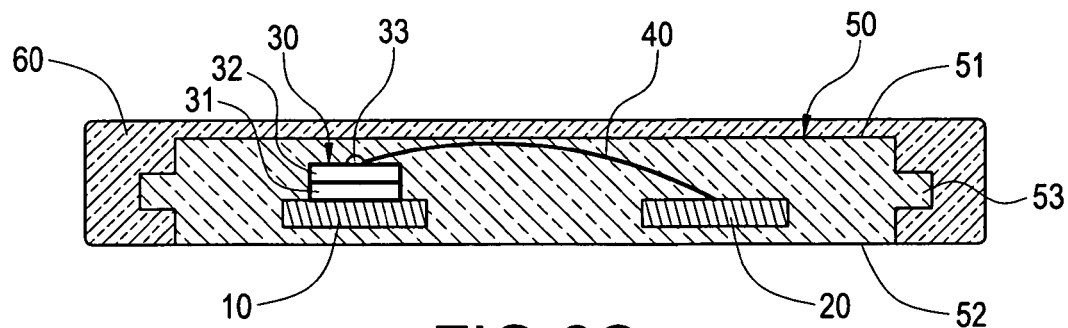
FIG. 6C is a cross-sectional view showing an illuminated surface of the insulating layer covering the light-transmitting body.
Figure 6D:
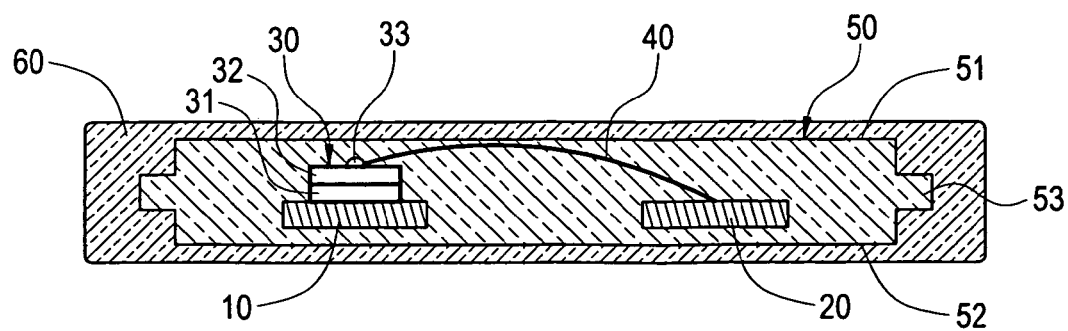
FIG. 6D is a cross-sectional view showing the insulating layer covering the light-transmitting body completely.

Please refer to FIG. 5. Via a hot pressing process, an insulating layer 60 covers the outer surface of the lead-exposing region 100 (step 86). The insulating layer 60 also covers the light-transmitting body 50 in a way as shown in FIGS. 6A to 6D. FIGS. 6A to 6D respectively show the insulating layer 60 not covering the light-transmitting body 50, the insulating layer 60 covering the back-lighted surface 52 of the light-transmitting body 50, the insulating layer 60 covering the illuminated surface 51 of the light-transmitting body 50, and the insulating layer 60 completely covering the light-transmitting body 50. Either side of the light-transmitting body 50 is provided with a protruding post 53 or rib for assisting the light-transmitting body 50 to be better combined with the insulating layer 60 via the hot pressing process. Further, as shown in the figures, when a wiring process is performed, the metallic lead 40 will be positioned in a level slightly higher than that of the surface of the light-emitting diode crystal 30. Thus, the height of the light-transmitting body 50 has to be larger than that of the metallic lead 40, thereby covering the light-emitting diode crystal 30 and the metallic lead 40 completely.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A method for manufacturing a light-emitting diode light bar, comprising the steps of:
   (a) providing a first lead and a second lead that are juxtaposed with a distance;
   (b) providing a light-emitting diode crystal having a first electrode and a second electrode;
   (c) electrically fixing the first electrode of the light-emitting diode crystal to the first lead; and
   (d) electrically connecting the second electrode of the light-emitting diode crystal to the second lead via a metallic lead;
   (e) using a light-transmitting body to package the light-emitting diode crystal and the metallic lead, forming a lead-exposing region respectively in the first lead and the second lead on both sides of the light-transmitting body; and
   (f) thermally pressing an insulating layer so as to cover the outer surface of the lead-exposing region.

2. The method according to claim 1, wherein the step (c) is followed by an additional step (c') of forming a metallic pad on the second electrode of the light-emitting diode crystal.

3. The method according to claim 2, wherein the metallic lead is electrically connected to the metallic pad and the second lead in the step (d).

4. The method according to claim 1, wherein in the step (e), one side of the light-transmitting body for packaging the light-emitting diode crystal is referred to as an illuminated surface, and the other side is referred to as a back-lighted surface.

5. The method according to claim 4, wherein the insulating layer further covers the back-lighted surface of the light-transmitting body in the step (f).

6. The method according to claim 4, wherein the insulating layer further covers the illuminated surface of the light-transmitting body in the step (f).

7. The method according to claim 4, wherein the insulating layer further covers the light-transmitting body in the step (f).

* * * * *